United States Patent [19]
Polenz

[11] 3,978,749
[45] Sept. 7, 1976

[54] CUTTING DEVICE FOR COATED PLATES

[75] Inventor: Walther Polenz, Wiesbaden, Germany

[73] Assignee: Hoechst Aktiengesellschaft, Germany

[22] Filed: Nov. 17, 1975

[21] Appl. No.: 632,806

[30] Foreign Application Priority Data
Nov. 20, 1974 Germany............................ 2454919

[52] U.S. Cl.................................. 83/169; 83/100; 83/171; 83/203; 83/467 R; 83/522; 83/614; 83/648
[51] Int. Cl.²........................................ B26F 3/08
[58] Field of Search ............. 83/169, 100, 171, 16, 83/614, 467, 203, 648, 522

[56] References Cited
UNITED STATES PATENTS
3,732,767 5/1973 Habert................................. 83/171
3,805,652 4/1974 LaLonde et al. .................. 83/614 X FOREIGN PATENTS OR APPLICATIONS
583,224 12/1946 United Kingdom.................... 83/171

Primary Examiner—Frank T. Yost
Attorney, Agent, or Firm—James E. Bryan

[57] ABSTRACT

This invention relates to a cutting device for coated plates comprising frame means, first stationary cover plate means on said frame means, second movable cover plate means on said frame means, heatable knife means adapted to be displaced along one edge of said first stationary cover plate means between said first and second cover plate means, carriage means below said cover plate means for supporting said knife means, and means for displacing said carriage means and said knife means supported thereby.

15 Claims, 10 Drawing Figures

CUTTING DEVICE FOR COATED PLATES

The present invention relates to a cutting device for coated plates, which device includes a supporting table with cover plates arranged in a frame.

The coated plates may be, for example, circuit boards onto which the image of a printed circuit is projected. Such circuit boards are subsequently etched and thus the desired printed circuit is obtained. The plates intended to form the support materials may be coated, for example with a flat photographic material containing a photopolymerizable compound in its light-sensitive layer, the light-sensitive layer being disposed between a transparent support layer and a protective top layer. Before transferring this flat photographic material onto the surface of a support material, the protective top layer is removed and then the surface of the support material, to which an image is to be later applied, is directly laminated with the flat material without the top layer. The support material coated in this manner is then exposed to appropriate radiation through a transparent original arranged on the transparent support layer, the support layer is removed from the photographic layer, and the exposed photopolymerizable layer is developed by removal of the unexposed areas by means of a solvent. The support material, for example a metal or plastic plate, a flat web or the like, is etched or plated and then may be used for various purposes, for example as a printing plate, a metal plate, or, as mentioned above, as a printed circuit.

In a known apparatus for the production of the flat photographic material, a dry photopolymerizable layer is first applied to a web-like flexible support layer or supporting film by means of a coating machine, and then covered with a protective top layer. Thus, a plate coated with a laminate is obtained in which the photographic layer is very uniform and completely protected, which particularly facilitates storage and use thereof.

In general, the support plates to be coated with the laminate have various sizes and are continuously fed into the running laminating apparatus in such a manner that the photopolymerizable layer of the web-like laminating layer is placed on the surface of the support plates, so that the laminating layer connects successive support plates. In order to make the support plates ready for use, it is then necessary to separate them from the continuous laminating layer by cutting along the edges of the support plates.

Hitherto, it has been common in practice for support plates coated in this manner to be manually separated by means of appropriate, unheated knives. This has the disadvantage that at the rough edges of the plates narrow projections of laminate are formed which are composed of the protective top layer and the photopolymerizable layer and which may lead to separation of the protective top layer during handling of the plate. As a further disadvantage, the originally tacky and flexible photoresist, i.e. the photopolymerizable layer, becomes so brittle by exposure that it splinters into small particles at the free projections, thus causing further damage in the production of the circuit boards which may result in extensive and costly waste. Further, the cutting with cold knives along the rough edges of the plates causes problems insofar as, although in the case of support plates coated on both sides the upper laminating layer may be perfectly cut, the lower laminating layer on the underside of the support plate may be cut imperfectly, because the pressure manually exerted upon the knife is not sufficient, and the lower protective layer may detach itself from the support plate. Another disadvantage is that the manual processing and cutting of the support plates is time-consuming and requires a great effort on the part of the operator, so that it is also expensive. A further disadvantage is that the blade may very easily get stuck at the rough edges of the plates, so that it becomes blunt within a short time and produces cutting edges which are no longer straight.

Thus, it is the object of the present invention to provide an apparatus which makes it possible to cut plates of different sizes without embrittlement of the photopolymerizable compound of the laminate and consequent splintering of the photopolymerizable layer at the edges of the plates. As a further object of the present invention, the propagation of the vapors released during cutting of the coated support plates is prevented.

This object is achieved by means of a cutting device as described above comprising a first cover plate which is stationary and connected with the frame, a second cover plate which is movable along the longitudinal sides of the frame, an electrically heatable knife which is capable of displacement along the inner edge of the stationary cover plate, over the width of the frame, the knife being attached to a carriage arranged below the level of the cover plates and its forward and backward movements, as well as the electric heating of the knife, being controlled by a circuit arrangement, and a suction funnel which is arranged above the knife and can be moved with it. The knife is advantageously provided with two cutting edges so that it can cut during its forward and its backward movement. Thus, it is possible to make optimum use of the cutting speed of the knife, since one plate edge can be cut during the forward movement of the knife and another during its backward movement.

Preferably, below the stationary cover plate a first guide means extends across the width of the frame, along which the carriage with the knife can be moved. In order to ensure an exact guidance of the carriage, it is preferred to arrange, below the first guide means and parallel to it, a second guide means along which the guide pulleys of the carriage roll. The guide means are preferably guide shafts.

Since the support plates may have different sizes, a stop bar is preferably arranged at one longitudinal edge of the frame, and a guide plate is attached to one end thereof, at right angles to the longitudinal edge of the bar, the guide plate resting against one outer edge of the stationary cover plate and being guided along this outer edge when the stop bar is displaced. The stationary cover plate has a slot therein which extends parallel to its inner and outer edges and through which a fixing screw passes which engages a guide block on the underside of the stationary cover plate. The stop bar is guided, on the one hand, by the guide block below the slot and, on the other hand, by the guide plate resting against the outer edge of the stationary cover plate, so that the stop bar remains always parallel to the longitudinal edge of the frame of the support table when it is moved.

At the guide block, a first switch is preferably arranged which, during the forward and backward movement of the carriage, can be brought into contact with and actuated by a sleeve which encircles the first guide shaft.

The distance between the movable cover plate and the stationary cover plate is preferably determined by means of screws passing through the longitudinal walls of the frame and through grooves in longitudinal ledges on the movable cover plate which rest against the inside of the longitudinal walls of the frame. Due to the fact that the distance between the movable and the stationary plates may be adjusted, the distance may be selected such that the waste laminate drops through the frame of the table into a waste container provided for this purpose. The frame is open below the movable cover plate for this purpose, but closed by a bottom plate below the stationary cover plate.

The circuit arrangement of the invention comprises a transformer for heating the knife, the transformer being an auto-transformer which can be switched on and off via a relay, for preheating the knife. The relay is connected in series with a second switch attached to the frame and with a two-way switch at one of the two terminals of the mains voltage supply. A control unit of the circuit arrangement preferably supplies D.C. voltage to a motor which causes the forward and backward movement of the carriage carrying the knife and to the armature winding coil of the motor, and further supplies the control voltage to an overload relay. Depending on the position of the overload relay, the D.C. output of the control unit for the armature winding coil of the motor selectively may be connected with two pairs of contacts of the overload relay, which apply, in their open and closed positions, a D.C. voltage of alternating polarity to the armature winding coil of the motor connected to the output of the overload relay, so that the motor changes its sense of rotation with each switching over of the pairs of contacts.

A first wire connects a contact of the two-way switch to the second switch and to a timing relay in which the delay time can be adjusted, the timing relay opening and closing a relay contact in an interconnection leading to the control unit and controlling the supply or interruption of current to the control unit.

The present invention has the advantages that by cutting the coated support plate with an electrically heated knife, an exact cut of the laminate is achieved, the projecting portion of the film and resist layer being melted to the edges of the plate by the protective top layer and the photopolymerizable layer, so that, after exposure of the support plate, there is no lifting, i.e. removal of the photoresist layer, nor are fragments of photoresist formed by embrittlement. Furthermore, by the automation of the cutting operation, processing of the coated support plates becomes considerably faster, simpler and easier, as compared to manual cutting by means of cold knives.

The invention will now be further illustrated by reference to the accompanying drawings, in which.

Figure 1:
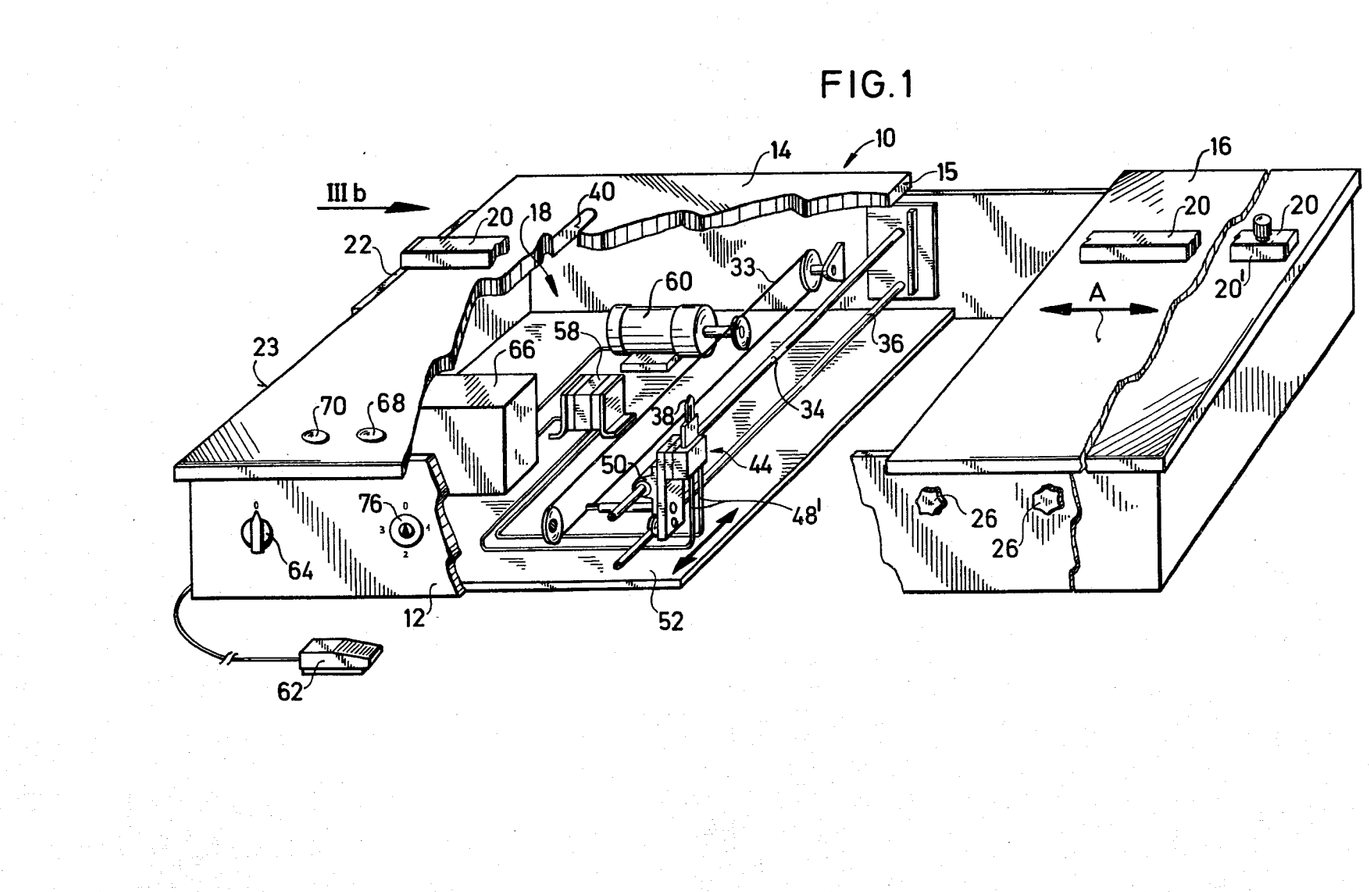
FIG. 1 is a perspective view of the supporting table with the knife and the schematically indicated circuit arrangement and the driving mechanism.
Figure 2:
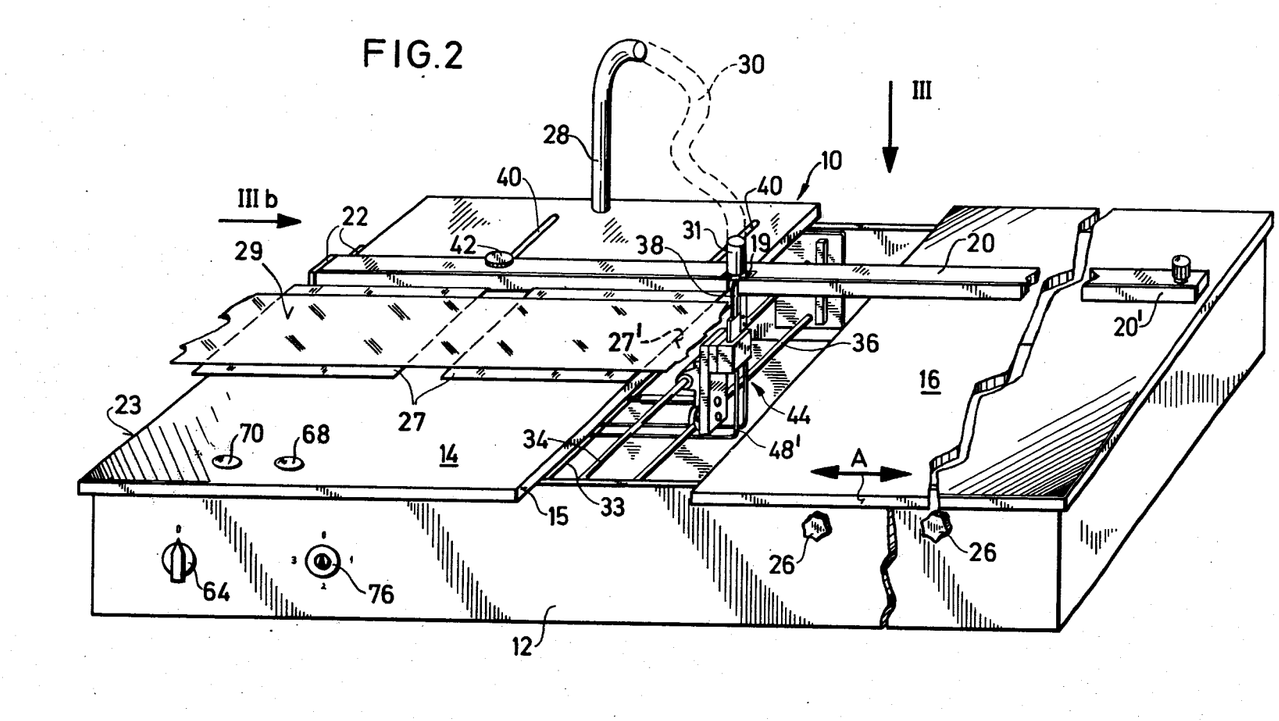
FIG. 2 is a perspective view according to FIG. 1, showing an indicated series of consecutive support plates connected with each other by a one piece laminating web disposed on the surfaces thereof.
Figure 5:
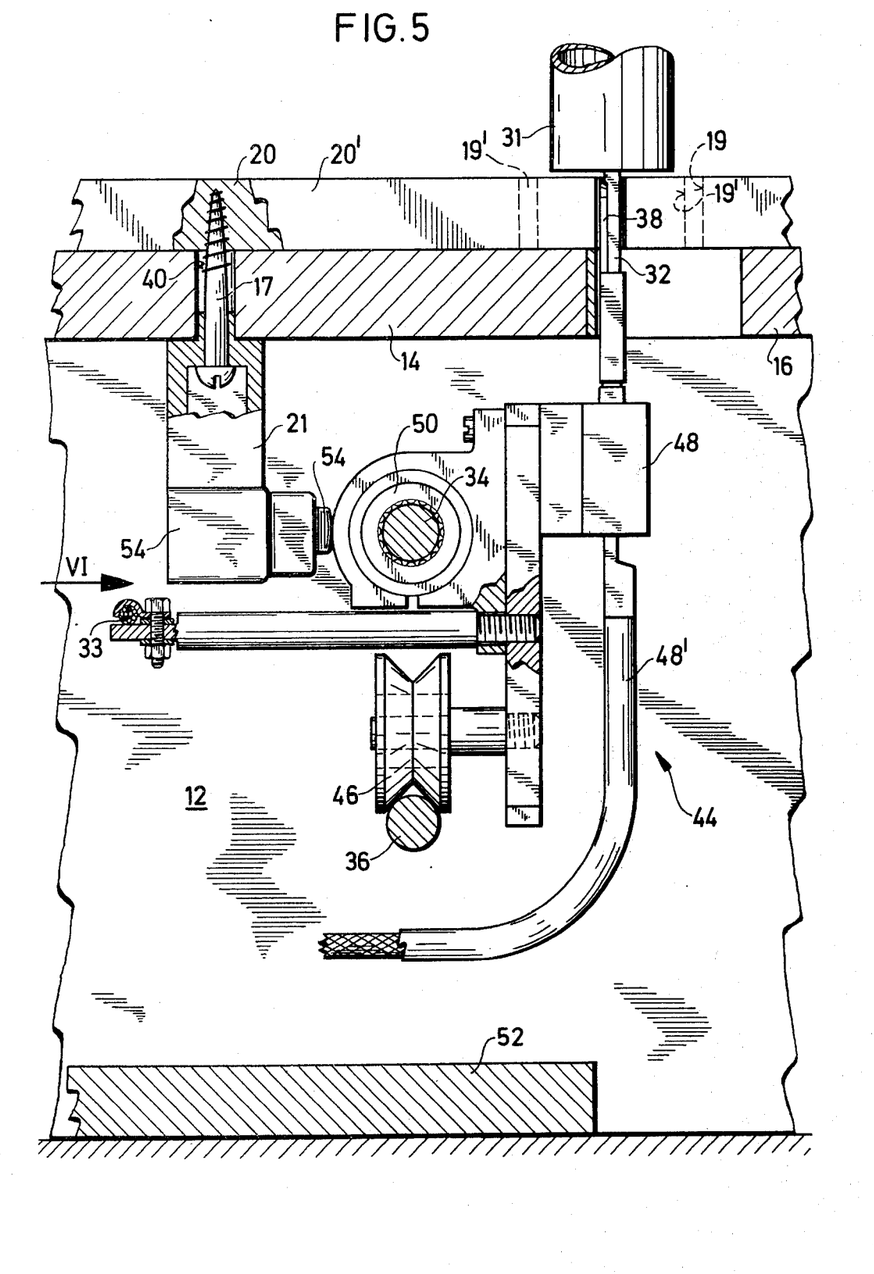

The supporting table 10 shown in FIGS. 1 and 2 has a frame 12 which is covered by a first, stationary, cover plate 14 and a second, movable, cover plate 16. Below the stationary cover plate 14, a bottom plate 52 is provided which is shown in FIG. 5. In the space surrounded by the stationary cover plate 14, the frame 12, and the bottom plate 52, there is a circuit arrangement 18 comprising a motor 60, for example a motor driven by a belt transmission, which causes the forward and backward movement of the carriage 44 carrying the knife 38. Furthermore, there is a transformer 58 for heating the knife 38, and a control unit 66 which will be described in more detail hereinafter.

The knife 38 which can be electrically heated by means of the transformer 58 is capable of displacement along the inner edge 15 of the stationary cover plate 14, across the width of the frame 12. The carriage 44, to which the knife 38 is attached, is arranged below the level of the cover plates 14 and 16. The movable cover plate 16 can be moved in the direction of the arrow A and makes it possible to adjust the distance between the plate 16 and the stationary cover plate 14 in such a manner that, depending upon the size of the laminate layer 29 to be severed from a support plate 27, the cut-off portion drops at once through the frame 12 into a waste container, not shown. For this purpose, the bottom of the frame 12 is open in the area of the movable cover plate 16.

Above the knife 38, a suction funnel 31 is arranged which can be displaced together with the knife and draws off the vapors produced by the hot-cutting of the laminate. The suction funnel 31 opens into a flexible suction tube 30 connected to an exhaust pipe 28 which may lead, for example, into the open.

The knife 38 preferably has two cutting edges so that it cuts during its forward and backward movements. The cutting edges of the knife may, for example, be sharpened in such a manner that the planar surface of the knife 38 ensures a certain distance between the cutting edge of the knife 38 and the edge of the plate. Of course, the knife 38 also may be curved or may be a hot wire.

Below the stationary cover plate 14 and extending over the entire width of the frame 12, there are provided a first guide means, preferably a guide shaft 34, and, below and parallel to the first guide means, a second guide means, for example also a guide shaft 36, along which the carriage 44 with the knife 38 may be moved.

A master power switch 64, a potentiometer 76 for adjusting the control unit 66, and an opening for the wiring of a two-way switch 62 in the form of a foot switch, which triggers the movement of the carriage 44, are arranged on one of the longitudinal walls of the frame 12.

A stop bar 20 on the upper surfaces of the cover plates 14 and 16 and capable of being displaced so that it remains parallel to one of the longitudinal sides of the frame 12, is provided at one of its ends with a guide plate 22 arranged at a right angle to its longitudinal edge, the guide plate resting against the outer edge 23 of the stationary cover plate 14 and being guided along this outer edge 23 when the stop bar is moved.

The coated support plates 27 shown in FIG. 2 are connected with one another by the laminate web 29 which is composed of the photopolymerizable layer and a protective top layer applied thereto. In order to prepare the support plates 27 for processing, the laminate web 29 is severed along the edges 27' of the support plate 27.

Figure 3A:
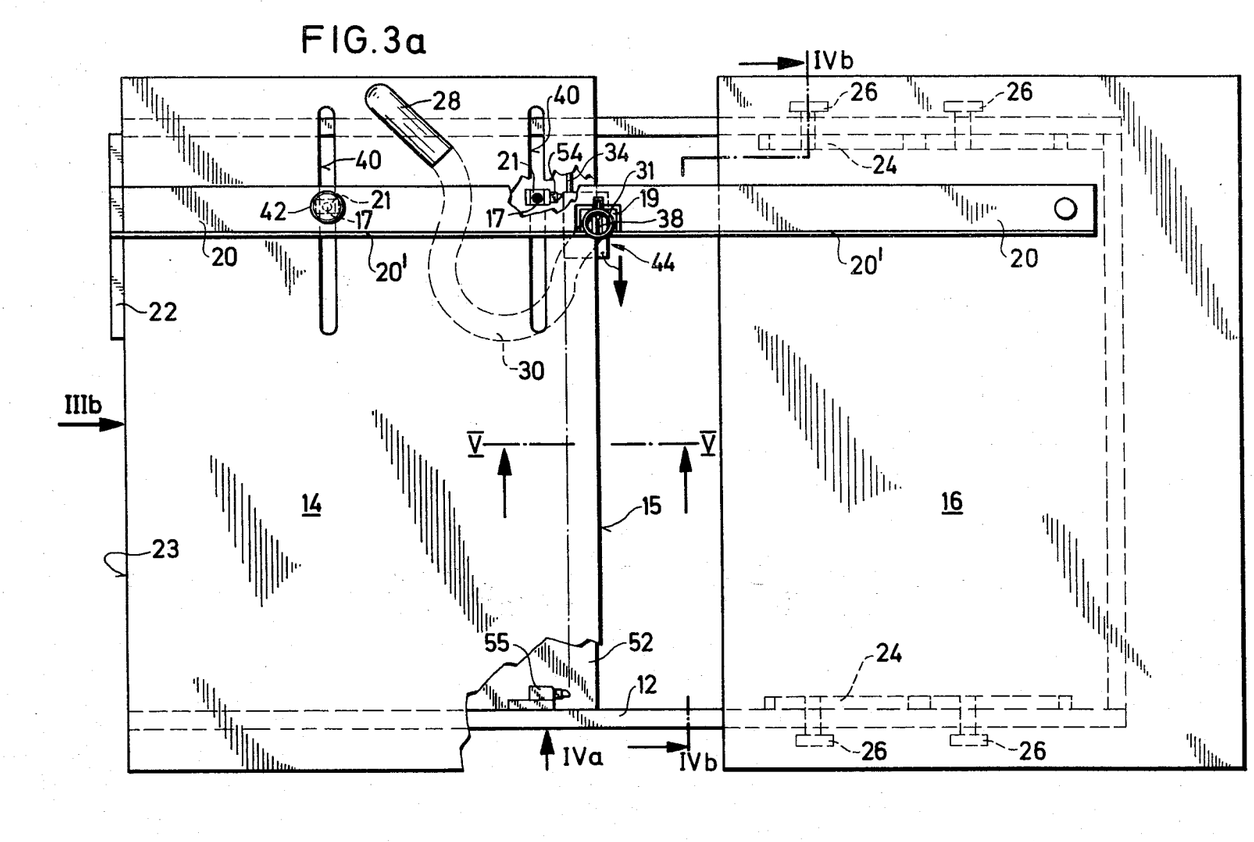
FIG. 3a is a plan view of the supporting table.
Figure 3B:
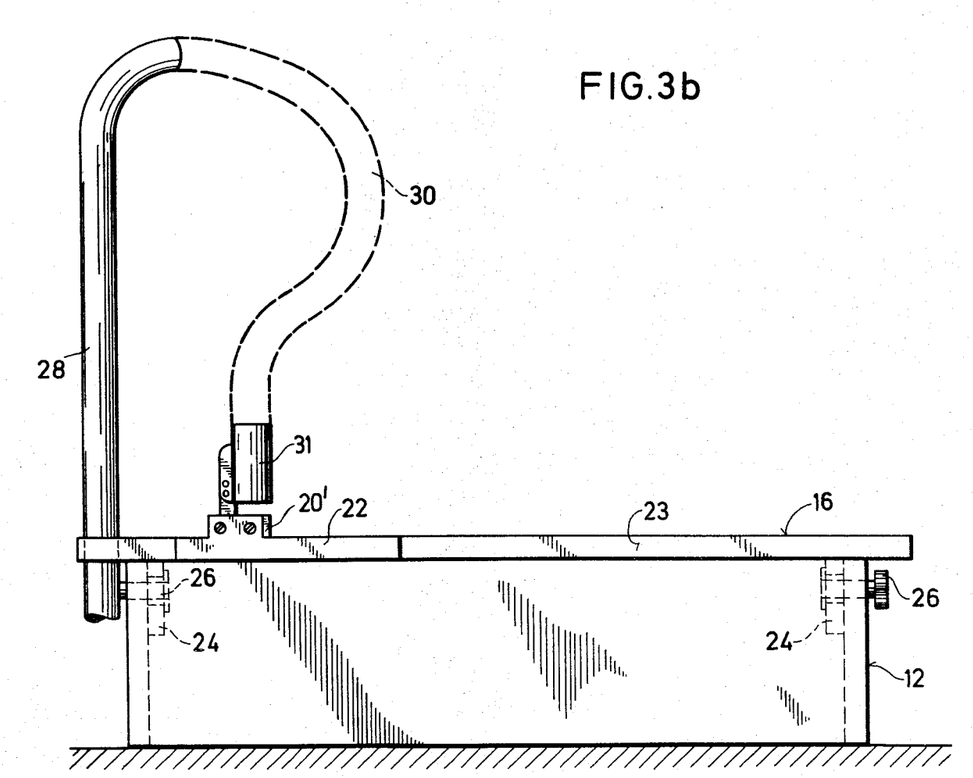
FIG. 3b is an enlarged side view according to FIG. 3a, of the supporting table and the guide plate of the stop bar.
Figure 3C:
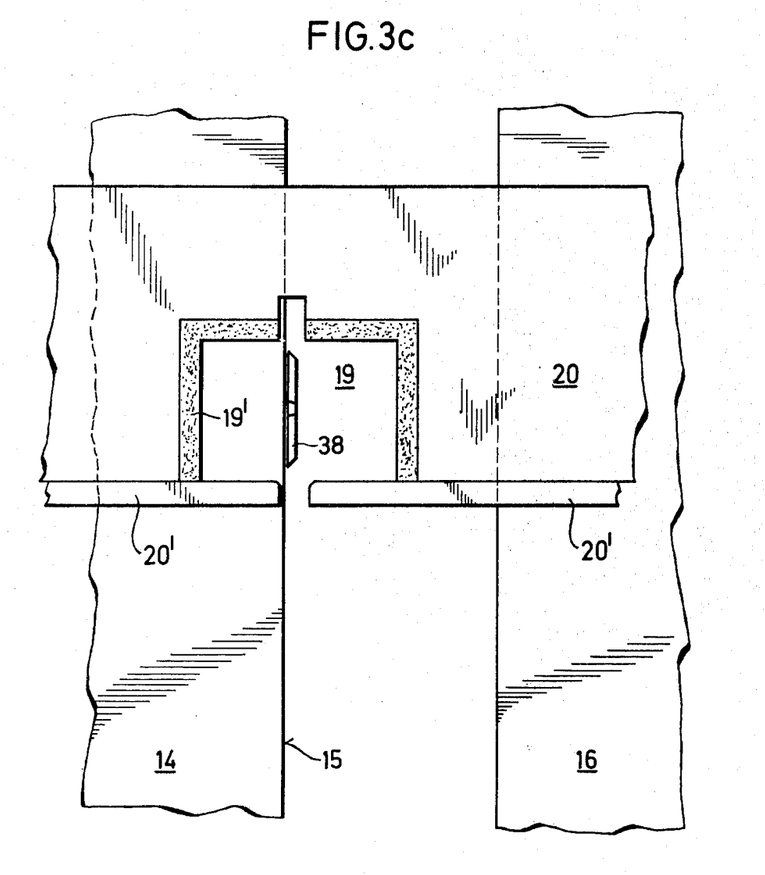
FIG. 3c is an enlarged view showing the opening in the stop bar which houses the knife.

As is shown in FIG. 3a, two slots 40 are provided in the stationary cover plate 14 which slots extend parallel to the inner and outer edges 15 and 23 of the cover plate 14. Through the slot 40 nearer to the outer edge 23, a fixing screw 42 is passed which engages a guide block 21 at the underside of the stationary cover plate 14, as is shown in FIG. 5. The longitudinal edge of the stop bar 20 may, for example, be covered by a rail 20' composed of aluminum or another metal. Approximately at the level of the inner edge 15 of the stationary cover plate 14, the stop bar 20 has an opening 19 which is provided with a heat insulation 19' and houses the knife 38 when it is in its rest position (FIG. 3c). Below the slot 40 nearer to the inner edge 15, a further guide block 21 is provided to which a first switch 54, for example a microswitch, is attached. In the direction of an extension of this slot 40, a second switch 55, which may also be a microswitch, is arranged on the inner side of the frame 12. The guide block 21 is fastened to the stop bar 20 by means of a screw 17.

Figure 4A:
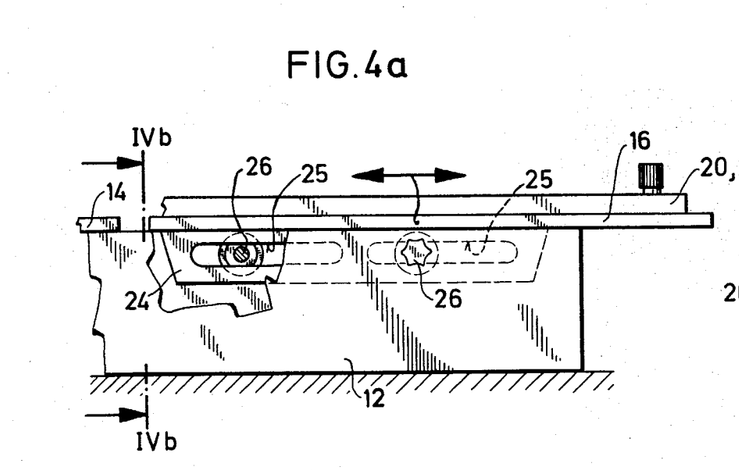
FIG. 4a is a partial side view of the supporting table frame, partly in section.
Figure 4B:
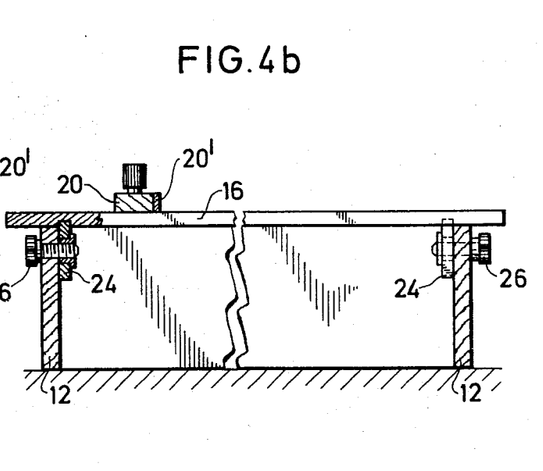
FIG. 4b is a section through the supporting table, taken along the line IVb—IVb of FIG. 3a, FIG. 5 is a detailed view, in section, of the carriage and the knife in the area indicated as V—V in FIG. 3a, FIG. 6 is a view of the carriage seen from the direction VI in FIG. 5.

As is shown in FIGS. 4a and 4b, the distance between the movable cover plate 16 and the stationary cover plate 14 may be adjusted by means of screws 26 which pass through the longitudinal walls of the frame 12 and through grooves 25 in the longitudinal ledges 24 of the movable cover plate 16. The longitudinal ledges 24 rest against the inner sides of the longitudinal walls of the frame 12 and serve as guide rails for moving the movable cover plate 16.

The carriage 44, shown in section in FIG. 5, includes a guide pulley 46 which rolls on the lower guide shaft 36 during the forward and backward movement of the carriage 44. The guide pulley may, for example, run in ball bearings. The upper guide shaft is preferably surrounded by a sleeve 50 which slides along the guide shaft 34 during the movement of the carriage 44. A bracket 48, which holds the knife 38, is attached to the carriage. The lead-in wire 48' for the knife 38 is connected to the bracket 48. The first switch 54, which is attached to the guide block 21, and the second switch 55 are actuated by contact with the sleeve 50 during the forward and backward movement of the carriage 44.

Figure 6:
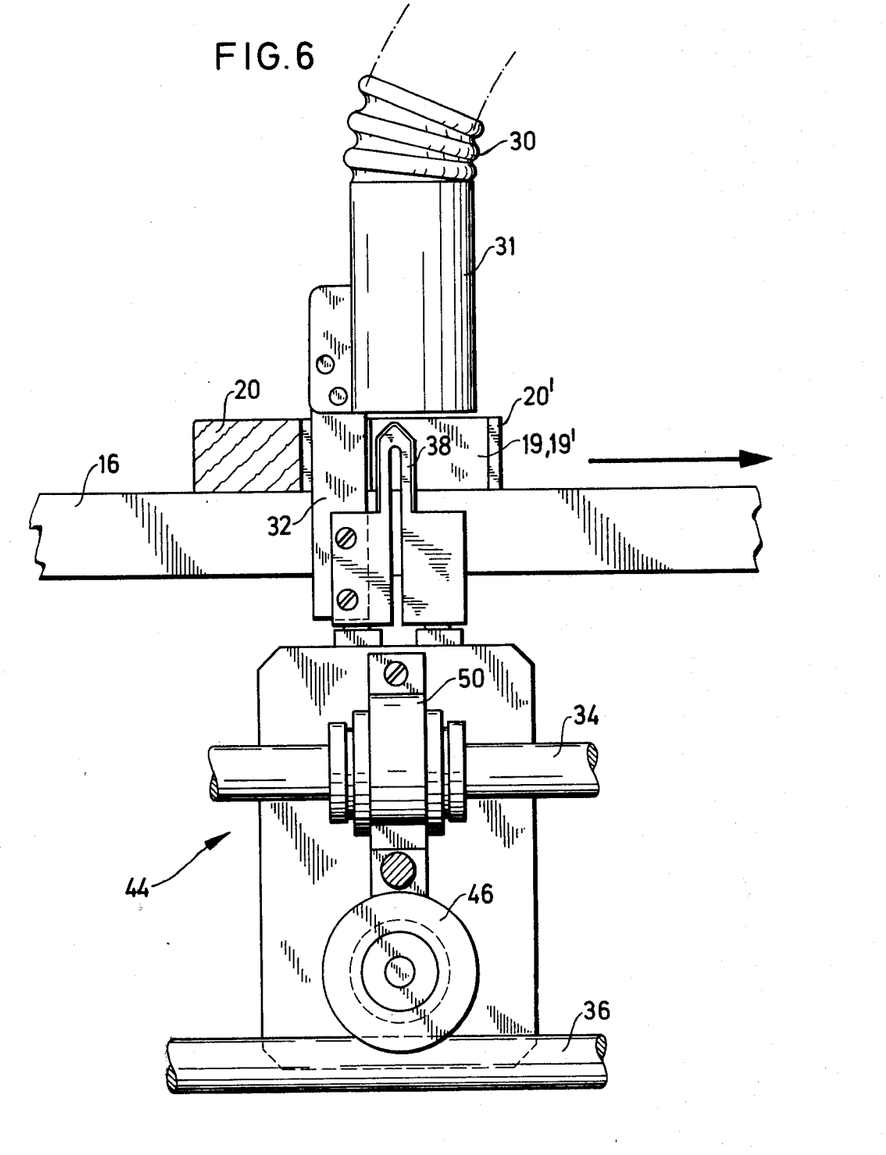

As shown in FIG. 6, a guide plate 32 for the mounting of the suction funnel 31 is attached to the carriage 44.

Figure 7:
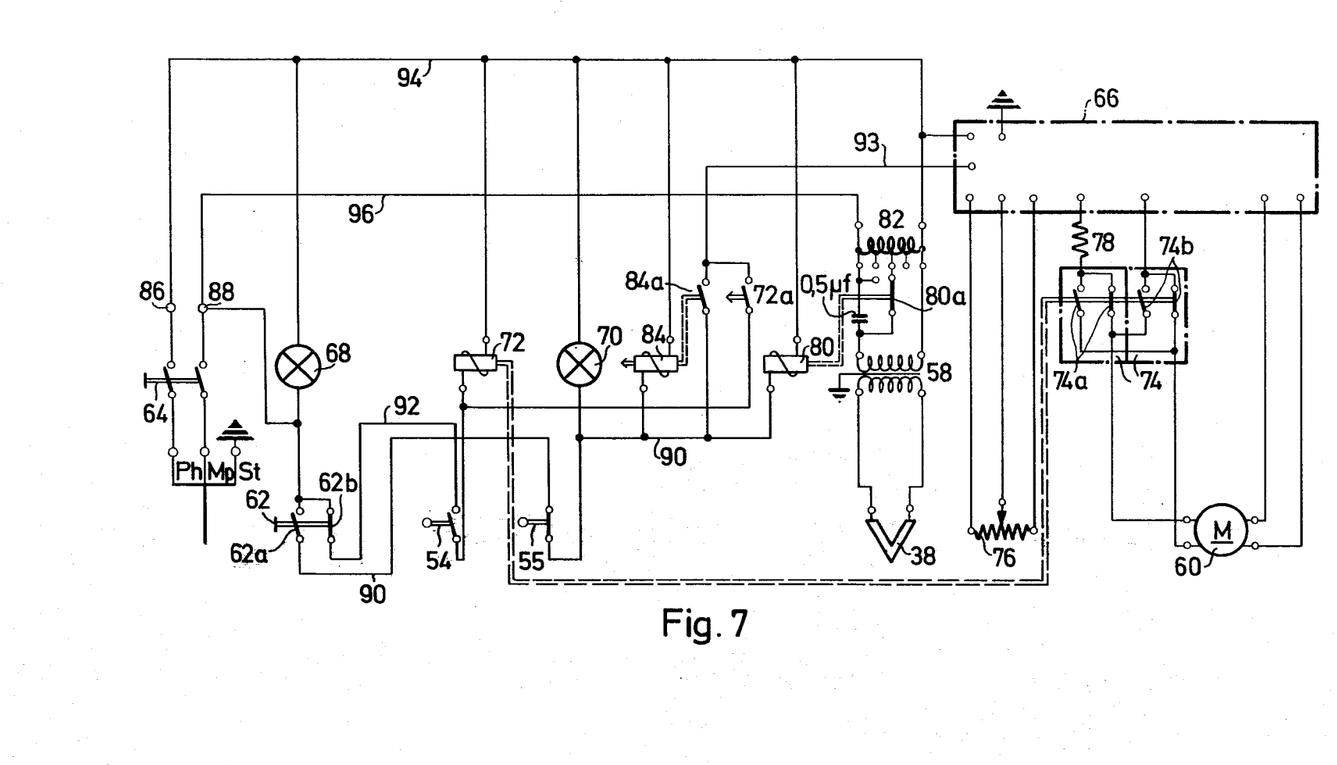
FIG. 7 shows the circuit arrangement of the cutting device according to the invention.

FIG. 7 shows the wiring diagram of the cutting device according to the invention. The electrical system is supplied with mains voltage by closing the master power switch 64. Parallel to the master power switch 64, a control lamp 68 is connected to the wires 94 and 96 for the mains voltage. The two-way switch 62, which is in the form of a foot switch, has two contacts 62a and 62b, 62a being open and 62b being closed when the foot switch is not pressed. A first wire 90 leads from the contact 62a to the second switch 55 which is a limit switch and is closed when the carriage 44 starts moving and which interrupts the heating of the knife 38 and the movement of the carriage 44 when open. A second wire 92 connects the contact 62b with the first switch 54, which is open when the knife 38 is in its rest position and is closed when the carriage 44 starts moving.

The wire 90 leads from the second switch 55 to a relay 80 the contact 80a of which switches an autotransformer 82 on or off for the preheating of the knife 38. The auto-transformer 82 is further connected to the mains voltage line 96. Parallel to the contact 80a of the relay 80, there is a suppression capacitor having, for example, 0.5$\mu$f, which is to prevent flashing over of sparks during the switching of the contact 80a.

A second control lamp 70, a time relay 84, and a contact 84a of the time relay 84 are connected to the first wire 90.

The second wire 92 leads first to a switch 54, then to the excitation winding 72 of an overload relay 74, and from there to a contact switch 72a which is actuated by the excitation winding 72. A connecting wire 93 leads from the contact 84a of the time relay 84 to the control unit 66.

The mains voltage wire 94 coming from a connecting terminal 86 is connected to a primary winding of the transformer 58 for heating the knife 38, which is also connected to the secondary winding of the transformer. The mains voltage wire 96 leading from a connecting terminal 88 to the auto-transformer 82 is connected with the primary winding of the transformer 58 via the contact 80a of the relay 80.

The potentiometer 76, which serves to control the speed of the motor 60, is connected to one output side of the control unit 66, which supplies the D.C. voltage to the motor 60 for the forward and backward movement of the carriage 44, to the armature winding coil of the motor 60, and supplies control voltage to the overload relay 74. The control unit 66 is a commercial transistorized control apparatus which includes a rectifier. A fixed resistor 78 for current limitation is connected in series with the overload relay 74. The overload relay 74 has two pairs of contacts 74a and 74b, which apply, in their open and closed positions, a D.C. voltage of alternating polarity to the armature winding coil of the motor 60 connected to the output of the overload relay 74, so that the motor 60 changes its sense of rotation with each switching over of the pairs of contacts 74a and 74b.

The cutting device is controlled in the following manner:

As long as the master power switch 64 is closed, the knife 38 is in its starting position in the opening 19 of the stop bar 20, and the contact 62a of the two-way switch 62 is opened, while the contact 62b of the two-way switch 62 is closed. In this position, the knife 38 is preheated to about 500°C by the auto-transformer 82 to which voltage is supplied.

If the two-way switch 62, which is in the form of a foot switch, is pressed down, the contact 62a is closed and the second switch 55, arranged at the frame 12 and connected in series, via the wire 90, to the two-way switch 62, remains in its closed position, as shown in FIG. 7. Thus the electric circuit for the second control lamp 70 is closed and the lamp lights up, indicating the start of the cutting operation. Further, the time relay 84 is switched on, which in turn switches on the control unit 66 after the predetermined delay time has elapsed. Simultaneously with the switching-on of the time relay 84, the auto-transformer 82 for the knife 38 is switched off by means of the relay 80. The relay contact 80a of the relay 80 switches over from the tapping point with the auto-transformer 82 into a position in which it shortcircuits the auto-transformer 82 and instead the full mains voltage is supplied to the primary winding of the transformer 58. Thus, the temperature of the knife 38, which reaches about 500°C when preheated by the auto-transformer 82 alone, is increased to 600° to 1,000°C or more.

During this switching process, the overload relay 74 is in its rest position, i.e. in the position shown in FIG. 7, and is kept in this position as long as the control unit 66 is in operation. In this position, the motor 60 receives D.C. voltage of a certain polarity for its armature winding via the closed contacts 74. The carriage 44 then moves from its starting position in the direction of the second switch 55. As soon as the sleeve 50 actuates the second switch 55, this switch is opened, thus interrupting the electric circuit leading to the time relay 84 and to the control unit 66 or to the primary winding of the transformer 58. The relay 80 changes its contact 80a over into the position shown in FIG. 7, which means that the knife 38 is again preheated by the auto-transformer 82. The motor 60 stops until the two-way switch 62 switches back to its starting position when the foot is removed from the two-way switch 62. The contact 72a of the excitation winding 72 for the overload relay 74 switches over, the contacts 74b are opened, while the contacts 74a close. In this manner, the armature winding of the motor 60 receives an opposite polarity, so that the sense of rotation of the motor 60 is reversed and the carriage 44 returns to its starting position. As soon as the carriage 44 touches the first switch 54 and opens it, the current supply to the control unit 66, via the wire 93, is interrupted and the motor 60 stops.

It will be obvious to those skilled in the art that many modifications may be made within the scope of the present invention without departing from the spirit thereof, and the invention includes all such modifications.

I claim:

1. A cutting device for coated plates comprising frame means,
    first stationary cover plate means on said frame means,
    second movable cover plate means on said frame means,
    heatable knife means adapted to be displaced along one edge of said first stationary cover plate means between said first and second cover plate means,
    carriage means below said cover plate means for supporting said knife means,
    and means for displacing said carriage means and said knife means supported thereby.

2. A device according to claim 1 including suction means mounted above said knife means and displaceable therewith.

3. A device according to claim 1 in which said knife means has two cutting edges, whereby it can cut in two directions.

4. A device according to claim 1 including a first guide means below said first stationary cover plate means along which guide means said carriage means is adapted to move.

5. A device according to claim 4 including second guide means below and parallel to said first guide means, said second guide means being adapted to support guide pulleys on said carriage means.

6. A device according to claim 5 in which said guide means are guide shafts.

7. A device according to claim 1 including stop bar means near a longitudinal edge of said frame means,
    guide plate means attached to one end of said stop bar means, resting against an edge of said first stationary cover plate means, and being guided by said edge when said stop bar means is displaced.

8. A device according to claim 7 including slot means in said first stationary cover plate means and extending parallel to edges of said cover plate means,
    fixing screw means extending through said slot means and engaging said stop bar means and guide block means on the underside of said cover plate means.

9. A device according to claim 8 including first switch means mounted at said guide block means, said switch means being adapted to be actuated during displacement of said carriage means.

10. A device according to claim 1 including screw means passing through walls of said frame and through grooves in ledges of said second movable cover plate means resting against said walls, whereby the position of said second movable cover plate means may be adjusted.

11. A device according to claim 1 including bottom plate means below said first stationary cover plate means.

12. A device according to claim 1 including means for operating said cutting device, said circuit comprising auto-transformer means adapted to be switched on and off via a relay and serving for preheating said knife means,
    said relay being connected in series with a second switch attached to said frame means and with a two-way switch at one of two terminals of a mains voltage supply.

13. A device according to claim 1 including control unit means adapted to supply D.C. voltage to motor means adapted to displace said carriage means, and also to supply control voltage to an overload relay.

14. A device according to claim 1 including control unit means adapted to supply D.C. voltage to an armature winding coil of a motor means adapted to displace said carriage means,
    and means whereby said voltage supply can be selectively connected with two pairs of contacts of an overload relay, depending upon the position of said relay,
    said contacts applying, in the open and closed positions thereof, a D.C. voltage of alternating polarity to said armature winding coil of said motor means connected to the output of the overload relay, whereby the sense of rotation of said motor means changes with each switching over of said pairs of contacts.

15. A device according to claim 1 including a first wire connecting a contact of a two-way switch with a second switch and with a timing relay with an adjustable delay time, said timing relay being adapted to open and close a relay contact in an interconnection leading to a control unit and controlling the current to said control unit.

* * * * *